United States Patent
Li et al.

(10) Patent No.: US 7,652,532 B2
(45) Date of Patent: Jan. 26, 2010

(54) CORRELATION METHOD FOR MONITORING POWER AMPLIFIER

(75) Inventors: Mingyuan Li, La Jolla, CA (US); Peter Asbeck, Del Mar, CA (US); Ian Galton, Del Mar, CA (US); Lawrence E. Larson, Del Mar, CA (US)

(73) Assignee: The Regents of the University of California, Oakland, CA (US)

( * ) Notice: Subject to any disclaimer, the term of this patent is extended or adjusted under 35 U.S.C. 154(b) by 527 days.

(21) Appl. No.: 11/515,584

(22) Filed: Sep. 5, 2006

(65) Prior Publication Data

US 2007/0069813 A1    Mar. 29, 2007

Related U.S. Application Data

(60) Provisional application No. 60/714,487, filed on Sep. 6, 2005.

(51) Int. Cl.
*H03F 1/32* (2006.01)
(52) U.S. Cl. .................................. 330/149; 455/115.2
(58) Field of Classification Search ................ 455/126, 455/114.3, 63.2, 114.2; 375/296, 269, 281, 375/284, 295, 285; 330/2, 151, 149, 51
See application file for complete search history.

(56) References Cited

U.S. PATENT DOCUMENTS

| | | | | |
|---|---|---|---|---|
| 4,291,277 A | * | 9/1981 | Davis et al. | 330/149 |
| 5,049,832 A | * | 9/1991 | Cavers | 330/149 |
| 5,732,333 A | * | 3/1998 | Cox et al. | 455/126 |
| 5,955,917 A | * | 9/1999 | Mandell et al. | 330/2 |
| 6,028,884 A | * | 2/2000 | Silberger et al. | 375/130 |
| 6,236,837 B1 | * | 5/2001 | Midya | 455/63.1 |
| 7,035,345 B2 | * | 4/2006 | Jeckeln et al. | 375/296 |

OTHER PUBLICATIONS

S. Boumaiza, F.M. Ghannouchi, "Realistic power-amplifiers with application to baseband digital predistortion for 3G base stations," IEEE Transactions Microwave Theory and Techniques, vol. 50, No. 12, pp. 3016-3021, Dec. 2002.
J.K. Cavers and M.W. Liao, "Adaptive compensation for imbalance and offset losses in direct conversion transceivers," IEEE Transactions on Vehicular Technology, vol. 42, pp. 581-588, Nov. 1993.

(Continued)

*Primary Examiner*—Matthew D Anderson
*Assistant Examiner*—Gennadiy Tsvey
(74) *Attorney, Agent, or Firm*—Greer, Burns & Crain, Ltd.

(57) ABSTRACT

The invention provides methods and devices for estimating power amplifier nonlinearity using simple correlation techniques. Methods and devices of the invention can monitor a power amplifier that has digitally modulated inputs and an output containing more than one signal stream. A preferred method of the invention creates a test signal by forming the products of several pseudorandom noise sequences from the digitally modulated inputs to the power amplifier. Nonlinear contributions of the power amplifier output are determined by cross-correlating the test signal and the total output signal of the power amplifier. In preferred embodiments, the determined nonlinear contributions of the power amplifier are used to introduce corrective predistortion in the power amplifier.

10 Claims, 16 Drawing Sheets

OTHER PUBLICATIONS

S.W. Chen, W. Panton and R. Gilmore, "Effects of nonlinear distortion on CDMA communications Systems," IEEE Transactions on Microwave Theory and Techniques, vol. 44, No. 12, pp. 2743-2750, Dec. 1996.

C.J. Clark, C.P. Silva, A.A. "Moulthrop and M.S. Muhal, Power-amplifier characterization using a two-tone measurement technique," IEEE Transactions on Microwave Theory and Techniques, vol. 48, vol. 50, No. 6, pp. 1590-1602, Jun. 2002.

S.C. Cripps, RF Power Amplifier for Wireless Communications:, Microwave Book/Software Reviews, Mar. 2000, p. 64.

L. Ding, et al, "A robust digital baseband predistorter constructed using memory polynomials," IEEE Transactions on Communications, vol. 52, No. 1, pp. 159-165, Jan. 2004.

K. Gard, M.B. Steer and L.E. Larson, "Generalized autocorrelation analysiss of spectral regrowth from bandpass nonliear circuits," IEEE MTT-S Digtest, vol. 1, Jun. 2001, pp. 9-12.

H. Ku, M.D. McKinle and J.S. Kenney, "Extraction of accurate behavioral models for power amplifiers with memory effects using two tone measurements," in IEEE MTT-S Digest, vol. 1, Jun. 2002, pp. 139-142.

S. Lee, Y. Lee, S. Hong, H. Choi, and Y. Jeong, "An adaptive predistortion RF power amplifier with a spectrum monitor for multicarrier WCDMA applications," IEEE Transactions on Microwave Theory and Techniques, vol. 53, No. 2, pp. 786-793, Feb. 2005.

M. Li, I. Galton, L.E. Larson, P.M. Asbeck, "Correlation techniques for estimation of amplifier nonlinearity," in IEEE Radio and Wireless Conf., Sep. 2004, pp. 179-182.

M.D. Mckinley, et al, "EVM calculation for broadband modulated signals," in 64th ARFTG Conf. Dig., Dec. 2004, pp. 45-52.

A.M. Saleh, "Frequency-independent and frequency-dependent nonlinear models of TWT amplifiers," IEEE Transactions on Communications, vol. 29, No. 11, pp. 1715-1720, Nov. 1981.

S.P. Stapleton, G.S. Kandola, and J.K. Cavers, "Simulation and analysis of an adaptive predistorter utilizing a complex spectral convolution," IEEE Transactions on Vehicular Technology, vol. 41, No. 4, pp. 387-393, Nov. 1992.

M. Windisch and G. Fettweis, "Adaptive I/Q imbalance compensation in low-IF transmitter architectures," in IEEE Vehicular Technology Conf., Dig., vol. 3, Sep. 2004, pp. 2096-2100.

G.T. Zhou and J.S. Kenney, "Predicting spectral regrowth of nonlinear power amplifiers," IEEE Transactions on Communications, vol. 50, No. 5, pp. 718-722, May 2002.

"Physical Layer Standard for cdma2000 Spread Spectrum Systems", Revision D, Version 2.0, $3^{rd}$ Generation Partnership Project 2 "3GPP2", Sep. 2005.

* cited by examiner

CORRELATION METHOD FOR MONITORING POWER AMPLIFIER

PRIORITY CLAIM AND REFERENCE TO RELATED APPLICATION

Priority is claimed under 35 U.S.C. §119 from prior provisional application Ser. No. 60/714,487, filed Sep. 6, 2005.

STATEMENT OF GOVERNMENT INTEREST

This invention was made with Government assistance under Army Research Office, Contract No. DAAD19-01-1-0496.

FIELD OF THE INVENTION

A field of the invention is power amplifiers. Embodiments of the invention concern RF and microwave power amplifiers for wireless communications with digitally modulated inputs and outputs having more than one signal stream. The invention may be implemented directly in forward-link CDMA systems (base stations) and can also be implemented in reverse-link systems (handsets).

BACKGROUND

Nonlinearities in power amplifier performance can harm performance. In the case of wireless networks, nonlinearities in the amplifiers of network stations, e.g., cellular base stations, can negatively affect the performance of the wireless network being served by the network station. One problem that can be caused by power amplifier nonlinearity is the creation of adjacent channel interference in a wireless communication network. The power amplifier is typically the most nonlinear part of wireless transmitters and its nonlinearity can lead to generation of interference in adjacent frequency channels, as characterized by the adjacent channel power ratio (ACPR), and loss of signal accuracy, as characterized by the error vector magnitude (EVM). Accurate amplifier nonlinearity characterization is a key step for amplifier linearization synthesis. Receiver nodes can have difficulty decoding communication packets when levels of adjacent channel interference are high.

Bench top and periodic tests are currently done using test pulses. However, variances in amplifier performance can be introduced by heat and age of the circuitry. Bench top tests thus fail to account for non-linearity that can occur during the operational life of a particular amplifier. Periodic tests may catch life time operational changes, and amplifier compensations may be implemented. However, periodic tests interrupt the normal operation of amplifiers, and degraded performance can occur during a period between periodic tests. Also, periodic and bench tests use test signals that may not reveal all non-linearities.

Conventional single tone or two-tone testing is widely used to extract the amplifier nonlinearity from AM-AM and AM-PM distortion or intermodulation distortion measurements. See, e.g., C. J. Clark et al., "Power-amplifier characterization using a two-tone measurement technique," IEEE Trans. Microwave Theory Tech., vol. 48, vol 50, no. 6, pp. 1590-1602, (June 2002); A. M. Saleh, "Frequency-independent and frequency-dependent nonlinear models of TWT amplifiers," IEEE Trans. Comm., vol 29, no. 11, pp. 1715-1720, (November 1981); H. Ku et al., "Extraction of accurate behavioral models for power amplifiers with memory effects using two tone measurements," in IEEE MTT-S S Int. Microwave Symp. Dig., vol. 1, pp. 139-142 (June 2002). Employing such measurements, the spectral regrowth and constellation distortions of complex digital modulated signals can be predicted by various behavioral PA models. See, e.g., S. W. Chen et al, "Effects of nonlinear distortion on CDMA communications Systems," IEEE Trans. Microwave Theory Tech., vol. 44, no. 12, pp. 2743-2750, December 1996; .G. T. Zhou and J. S. Kenney, "Predicting spectral regrowth of nonlinear power amplifiers," IEEE Trans. Commun., vol 50, no. 5, pp. 718-722, May. 2002; K. Gard et al, "Generalized autocorrelations of spectral regrowth from bandpass nonlinear circuits," in IEEE MTT-S Int. Microwave Symp. Dig., vol. 1, June 2001, pp. 9-12. However, these sinusoidal tone(s) approaches require special input signals and are generally not applicable for characterization of amplifiers during real-time operation.

Alternate adaptive methods with actual code-division-multiple-access (CDMA) signals have been investigated in both time and frequency domains. While such methods have the advantage of being implemented during amplifier operation, it imposes a high computational burden and requires complex hardware. For example, others have proposed addressing amplifier linearity by recording the output of the amplifier over a suitable period of time, and comparing it with the corresponding input signal after time alignment and scaling. See, e.g., S. P. Stapleton, et al., "Simulation and analysis of an adaptive predistorter utilizing a complex spectral convolution," IEEE Trans. Microwave Theory Tech., vol. 41, no. 4, pp. 387-393, (November 1992); S. Boumaiza & F. M. Ghannouchi, "Realistic power-amplifiers characterization with application to baseband digital predistortion for 3 G base stations," IEEE Trans. Microwave Theory Tech., vol 50, no. 12, pp. 3016-3021, (December 2002). The power amplifier output spectrum can be calculated by the fast Fourier transform (FFT) under operating conditions. This approach is often used in adaptive digital/RF predistortion and provides good linearization performance. However, high speed and high-resolution analog to digital converters (ADCs) and intensive digital signal processing (DSP) operation are usually required. Another approach that has been proposed is to directly analyze the spectrum components of output power from amplifiers with a simplified spectrum-analyzer-like architecture. S. Lee, et al., "An adaptive predistortion RF power amplifier with a spectrum monitor for multicarrier WCDMA applications," IEEE Trans. Microwave Theory Tech., vol 53, no. 2, pp. 786-793, (February 2005). With these techniques, hardware complexity is still quite high and hardware components have accuracy requirements.

SUMMARY OF THE INVENTION

The invention provides methods and devices using methods of the invention for estimating power amplifier nonlinearity using simple correlation techniques. Methods and devices of the invention can monitor a power amplifier that has digitally modulated inputs and an output containing more than one signal stream. A preferred method of the invention creates a test signal by forming the products of several pseudorandom noise sequences from the digitally modulated inputs to the power amplifier. Nonlinear contributions of the power amplifier output are determined by cross-correlating the test signal and the total output signal of the power amplifier. In preferred embodiments, the determined nonlinear contributions of the power amplifier are used to introduce corrective predistortion in the power amplifier.

DETAILED DESCRIPTION OF PREFERRED EMBODIMENTS

Figure 1:
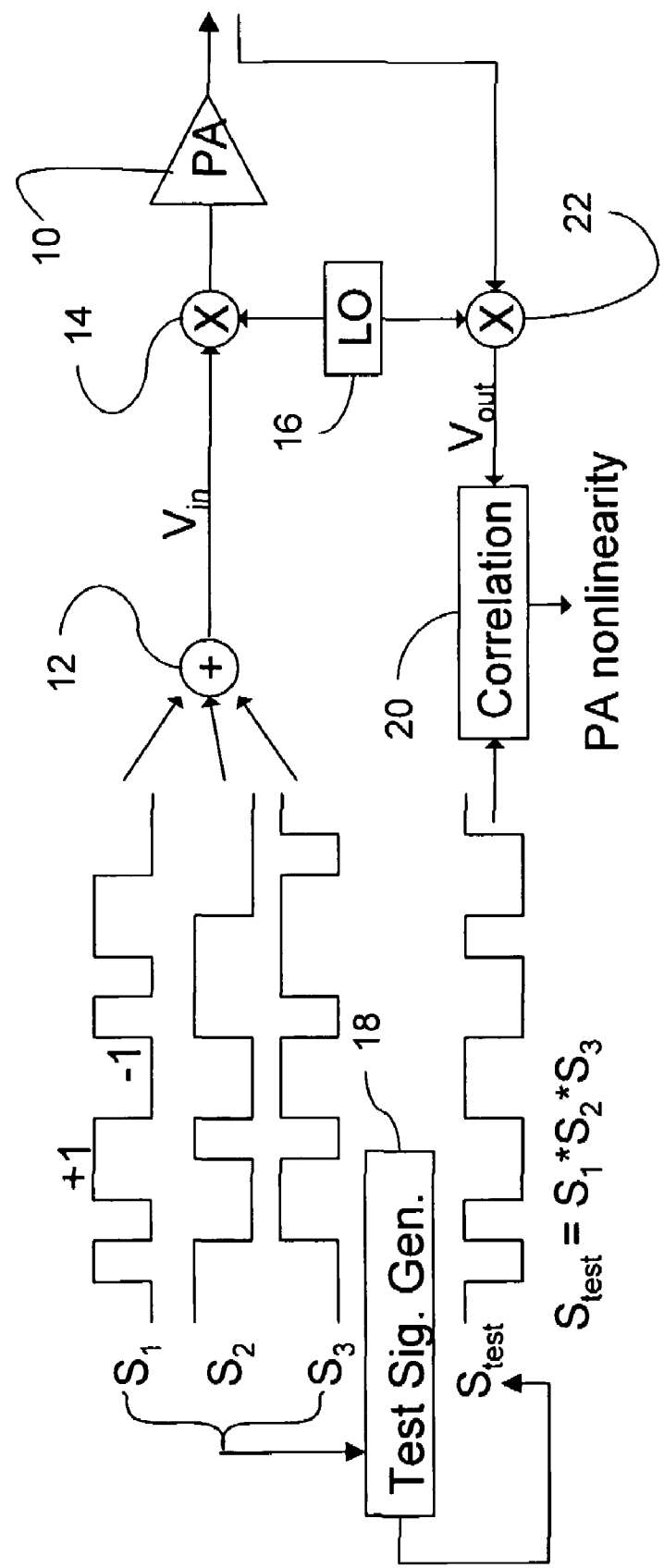
FIG. 1 is a schematic diagram illustrating a preferred method and device for estimating power amplifier nonlinearity in accordance with the invention.

The invention provides methods and devices for estimating power amplifier nonlinearity using simple correlation techniques. Methods and devices of the invention can monitor a power amplifier that has digitally modulated inputs and an output containing more than one signal stream. A preferred method of the invention creates a test signal by forming the products of several pseudorandom noise sequences from the digitally modulated inputs to the power amplifier. Nonlinear contributions of the power amplifier output are determined by cross-correlating the test signal and the total output signal of the power amplifier. In preferred embodiments, the determined nonlinear contributions of the power amplifier are used to introduce corrective predistortion in the power amplifier.

Preferred methods and devices of the invention can estimate power amplifier nonlinearity without interrupting the normal amplifier operation. The out-of-band output power and constellation distortion can be predicted by the correlation extraction values. Simple circuits with low hardware requirements are used in preferred embodiments to estimate nonlinearity and introduce corrective predistortion to the power amplifier. Methods and devices of the invention can also be used to conduct periodic and bench tests.

Methods and devices of invention are applicable to power amplifiers with digitally modulated inputs, where the output contains more than one signal stream. Methods of the invention are particularly well-suited to Direct-Sequence Code Divisional Multiple Access systems. For example, methods and devices of the invention are applicable to CDMA 2000 or WCDMA systems. The invention can be directly used in forward-link CAMA systems (base stations) which have well-defined multiple channels available to simplify adaptive predistortion systems. It is also possible to apply the invention to reverse-link applications (e.g., handsets) in high data-rate DS-CDMA systems, e.g., CDMA2000 and WCDMA. Embodiments of the invention permit implementation of digital or analog low-cost and low-power circuits in handsets to extract the power amplifier nonlinearity and to correct the amplifier nonlinearity with either digital or analog adaptive predistortion.

In embodiments of the invention, non-linearities in power amplifier operation of cellular base stations are detected, in real-time, and adaptive circuitry compensates for detected non-linearities to improve wireless network performance. Bench top and periodic tests are currently done using test pulses, but such techniques do not test actual operational performance of amplifiers in cellular base stations. Embodiments of the invention monitor base station power amplifier operation using actual information signals being handled by the amplifier, permitting continuous performance monitoring and corrective compensation. With the invention, variances in amplifier performance that can be introduced by the heat and age of the circuitry, can be accounted for throughout its operational life. Similarly, such variances in the power amplifiers of wireless network nodes, e.g., mobile handsets, can be accounted for through the operational life and corrective compensation implemented.

Preferred embodiment methods of the invention present a reasonable computational and hardware burden. Correlation is used to determine non-linearity and estimate spectral regrowth, with the nonlinearity between a test signal and the output signal being functions of the input signal. Test signals are generated from actual amplifier signals. For example, in preferred embodiments, non-linearity in the power amplifier of a multi-channel DS-CDMA system is monitored by correlation between output signals and test signals generated from the baseband CDMA signals.

In an embodiment of the invention, nonlinearity and memory effects of a power amplifier are estimated, during actual operation and/or during a calibration phase. The estimates are then used to control the predistortion of the input signal to the amplifier, to achieve a compensation of the amplifier output. The amplifier output envelope is cross-correlated with a test sequence generated by forming the product of multiple uncorrelated input sequences to yield estimates of low order nonlinearity coefficients.

Specific preferred embodiments of the invention will now be discussed with respect to the drawings. The drawings include schematic representations of device components, which will be fully understood by artisans with reference to the associated description. Embodiments of the invention can be implemented with analog or digital circuitry, as well as in software and/or firmware. Artisans will also appreciate broader aspects of the invention and additional inventive preferred features from the discussion of the preferred embodiments.

FIG. 1 illustrates a preferred method and device of the invention. In FIG. 1, a plurality of digitally modulated input signal sequences $S_i$ are provided to be amplified by a power amplifier 10. The input signals $S_i$ are, for example, DS-CDMA signals. In multi-channel DS-CDMA systems, for example, the binary digital input signal sequences $S_i$ are Walsh-code modulated and spread by pseudorandom noise (PN) code sequences. Several produced PN digital input sequences $S_i$ ($i$ is the channel index) have very little cross-correlation.

Figure 4:
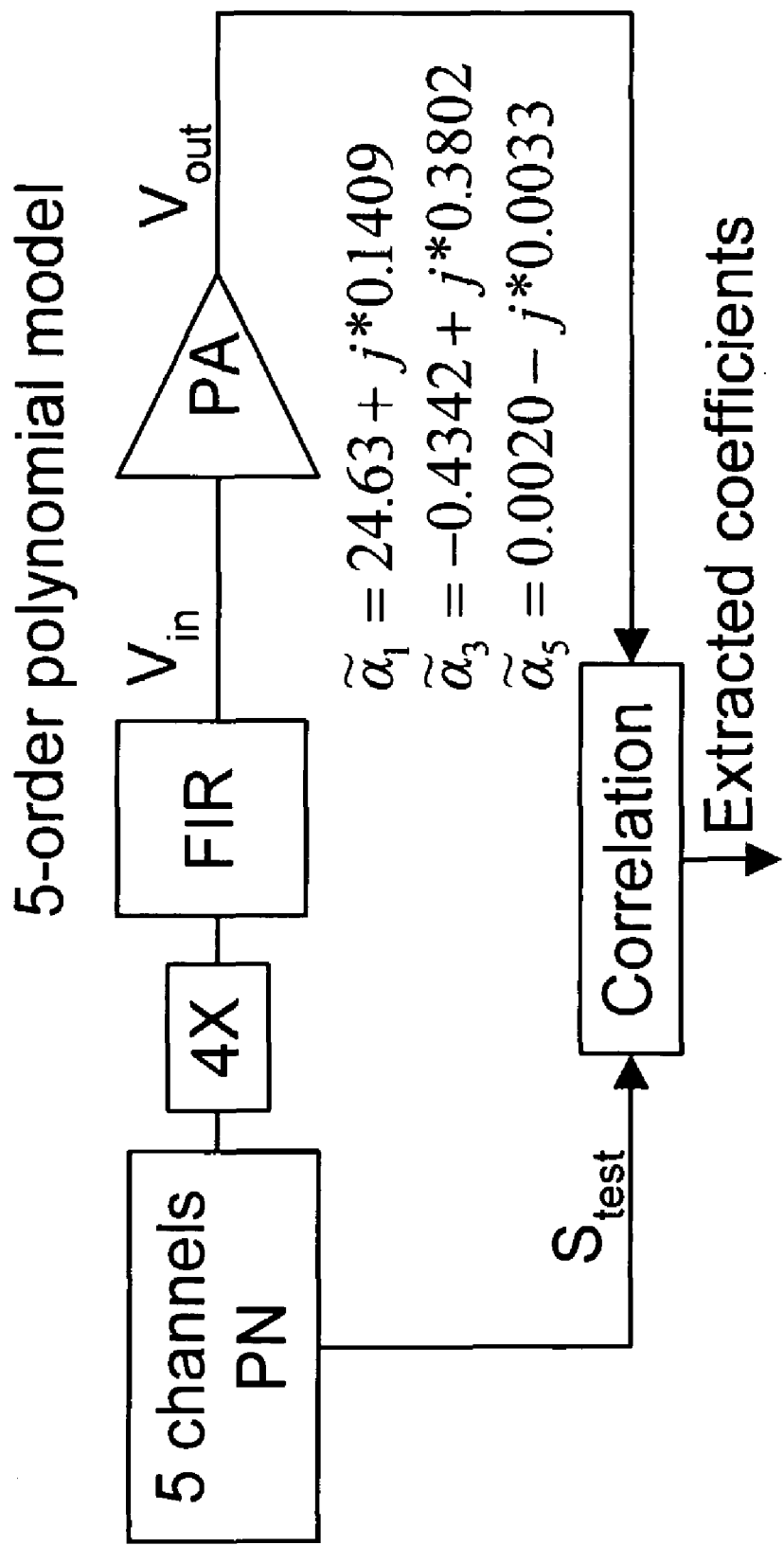
FIG. 4 illustrates a MATLAB simulation set-up that was used to verify the FIG. 1 method and device for estimating power amplifier nonlinearity in accordance with the invention.

In FIG. 1, as in a typical transceiver, such as a base station or handset, the digital inputs are summed by a summer 12 and up-converted by a mixer 14 prior to amplification by the power amplifier 10. The baseband input signal of the power amplifier 10 is the sum of $S_i$ filtered by a finite impulse response (FIR) filter after summer 12 and prior to mixer 14. The filter is a baseband waveform shaping filter, and its function is to generate the band-limited input signal to PA. For simplicity, the FIR is omitted in FIG. 1, but is shown in FIG. 4. A local oscillator 16 provides the baseband to radio frequency transformation. The baseband output signal of the power amplifier 10 is a nonlinear transform of the baseband input. Generally, it will contain third, fifth and sometimes higher order nonlinear contributions depending on the input.

In accordance with the FIG. 1 embodiment, a signal $S_{test}$ is created by a signal generator 18 by forming the products of $S_i$ for several PN sequences. $S_{test}$ is also a nonlinear function of the baseband input signal to the power amplifier. The nonlinear contributions of the power amplifier output can be extracted by the cross-correlation between $S_{test}$ and the total output signal. $V_{out}$ is the baseband total output signal. $V_{out}$ is the linear amplified version of the sum of $S_i$ plus the nonlinear amplified version of the sum of $S_i$, and only the nonlinear version is correlated with $S_{test}$, namely the amplified version of the sum of $S_i$. A cross-correlator 20 correlates $S_{test}$ and the total output signal Vout, which is provided from a mixer 22 that down-converts the output of the power amplifier 10 to extract $V_{out}$. The output of the cross-correlator provides an estimate of nonlinearity that can be used to provide predistortion to the power amplifier 10.

The number of sequences used to estimate the power amplifiers linearity determines the number of orders of nonlinearity that will be estimated, and can accordingly be accounted for by predistortion of the power amplifier 10. Different $S_{test}$ sequences can be created in order to evaluate the different orders of nonlinearity in the power amplifier output.

An example estimation will be discussed and mathematically analyzed to illustrate the operation of an example embodiment. In the following discussion, it is assumed for simplicity of analysis that the amplifier is a quasi-memoryless system with no significant memory effects within the modulation bandwidth. The bandpass nonlinearity of amplifiers can be described with a complex power series with odd order only.

$$\tilde{V}_{out} = \tilde{V}_{in}(\tilde{\alpha}_1 + \tilde{\alpha}_3 |\tilde{V}_{in}|^2 + \tilde{\alpha}_5 |\tilde{V}_{in}|^4) \quad (1)$$

where $\tilde{V}_{in}$, $\tilde{V}_{out}$ are the complex input and output envelope respectively, and $\tilde{\alpha}_1$, $\tilde{\alpha}_3$, and $\tilde{\alpha}_5$ are complex polynomial coefficients. In this example discussion, the correlation estimation conducted by the cross-correlator 20 in FIG. 1 is truncated to a fifth-order polynomial. Assessment of these lowest order nonlinearity terms is of primary importance to improve linearity, but the method of nonlinearity estimation is easily extended to additional orders by using additional input sequences. The trade-off is computational complexity, and there is a diminishing benefit for use of additional orders in the nonlinearity estimation.

In the invention, the nonlinear dependence of the output $V_{out}$ on the input $S_i$ is extracted by the correlations of the output $V_{out}$ and appropriately generated test sequences $S_{test}$, which are also nonlinear functions of the input. The $3^{rd}$ order test sequence $S_{test} = S_1 * S_2 * S_3$ is used here for analysis simplicity, although higher order nonlinearity can also be extracted in principle, with higher order test sequences.

The input baseband signal is described as a summation of three PN sequences $S_1$ to $S_3$ as follows:

$$V_{in}[k] = \sum_{i=1}^{3} S_i[k] \quad (2)$$

The output baseband signal is written by substituting (2) into (1), assuming the nonlinear transfer function of the power amplifier has real polynomial coefficients $\alpha_1$, $\alpha_3$, and $\alpha_5$ for simplicity, and the complex extension will be discussed later.

$$V_{out}[k] = a_1 \sum_{i=1}^{3} S_i[k] + a_3 \left(\sum_{i=1}^{3} S_i[k]\right)^3 + a_5 \left(\sum_{i=1}^{3} S_i[k]\right)^5 \quad (3)$$

The expansion of the $3^{rd}$ and $5^{th}$ order terms in (3) generates expanded terms $S_1^i * S_2^j * S_3^k$, where i, j and k are odd integer numbers with constraints i+j+k=3 or i+j+k=5. These terms are called equivalent $S_{test}$ terms because they are proportional to the $3^{rd}$ order $S_{test}$ PN sequence. The remaining terms are called non-$S_{test}$ terms, and they are uncorrelated with the $S_{test}$ sequence. The output signal can be written as a function of $S_{test}$ terms and other non-$S_{test}$ terms:

$$V_{out}[k] = \underbrace{(C_1 a_3 + C_2 a_5)}_{\bar{a}_3} S_{test}[k] + \quad (4)$$

$$(C_3 a_1 + C_4 a_3 + C_5 a_5) \sum_{i=1}^{3} S_i[k]$$

where $\bar{\alpha}_3$ is called the equivalent $3^{rd}$ order nonlinear coefficient, which is a combination of polynomial coefficients $\alpha_3$ and $\alpha_5$. $C_i$ (i from 1 to 5) are numerical constants, which depend on the input channel number and polynomial order. Their values are determined from the numerical polynomial expansion coefficients for a fifth-order nonlinear model with three input channels as shown in (5).

$$C_1 = 3! = 6, \quad (5)$$

$$C_2 = 3!\binom{5}{2} = 60,$$

$$C_3 = 1,$$

-continued $$C_4 = 1 + (3-1)\binom{3}{1} = 7$$

$$C_5 = 1 + (3-1)\binom{5}{1} + (3-1)\binom{5}{2} + 3!(3-2)\binom{5}{1} = 61$$

where ( ) is the combination operator.

The focus in the above analysis is the baseband signal processing and it was assumed that the effects of the frequency conversion parts of the transmitter on the correlation method can be ignored when the principal impairments of the modulators or demodulators are compensated by various known methods. See, e.g., J. K. Cavers & M. W. Liao, "Adaptive Compensation for Imbalance and Offset Losses in Direct Conversion Transceivers," IEEE Trans. Technology, vol. 42, pp. 581-588, (November 1993); M. Windisch & G. Fettweis, "Adaptive I/Q Imbalance Compensation in Low-IF Transmitter Architectures," IEEE Vehicular Technology Conf., Dig., vol. 3, pp. 2096-2100 (September 2004).

The time average cross-correlation function of $V_{out}$ and $S_{test}$ in discrete time format is defined as:

$$R_{Vout,Stest}[m] = \frac{1}{L}\sum_{k=1}^{L} V_{out}[k]S_{test}[k+m] \quad (6)$$

where L is the sequence length and m is the offset index. Substituting (4) into (6), (6) can be rewritten as:

$$\frac{1}{L}\sum_{k=1}^{L}\left\{\bar{a}_3 S_{test}[k] + (C_3 a_1 + C_4 a_3 + C_5 a_5)\sum_{i=1}^{3} S_i[k]\right\} * S_{test}[k+m] \quad (7)$$

The maximum cross-correlation value occurs at zero offset position by PN sequences correlation properties.

$$R_{Vout,Stest}[0] = \frac{1}{L}\sum_{k=1}^{L} \bar{a}_3 S_{test}[k]^2 + \frac{1}{L}\sum \text{other\_terms} \quad (8)$$

The dominant term in (8) is the square of the $S_{test}$ term; other terms will be averaged to zero, and the maximum value is proportional to $\bar{a}_3$.

In practical transmitters, the PN sequences will pass through a finite-impulse-response (FIR) waveform-shaping filter before up-conversion. The analysis of this case is very similar to the case without a filter as discussed before. The difference is that the input is a summation of several filtered PN sequences as shown in (9).

$$V_{in}[k] = \sum_{i=1}^{3} F_i[k] \quad (9)$$

$$= \sum_{i=1}^{3}\sum_{j=0}^{J} \mu_j S_i[k-j]$$

where $\mu_j$ (j from 0 to J) are the filter's coefficients, of which the maximum is assumed to be $\mu_r$.

With regard to (9), the cross-correlation of the output baseband signal and the $S_{test}$ sequence with an input FIR baseband filter can be derived. As shown in (9), the baseband input is a summation of three filtered PN sequences. Substituting (9) into (1), the output signal is written as:

$$V_{out}[k] = a_1\sum_{i=1}^{3}\sum_{j=0}^{J}\mu_j S_i[k-j] + a_3\left(\sum_{i=1}^{3}\sum_{j=0}^{J}\mu_j S_i[k-j]\right)^3 + \quad (9.1)$$

$$a_5\left(\sum_{i=1}^{3}\sum_{j=0}^{J}\mu_j S_i[k-j]\right)^5$$

Similarly, the expansion of (9.1) generates $S_{test}$ terms and other non-$S_{test}$ terms. There are many potential candidates for $S_{test}$ terms after the expansion. For example, the $3^{rd}$ order $S_{test}$ terms can be any of the form $$S_{test}[k-j] = S_1[k-j] * S_2[k-j] * S_3[k-j] \quad (9.2).$$

where j (from 0 to j) is the offset delay. The coefficients of these $S_{test}$ terms are proportional to the filter's coefficients $\mu_j$. To achieve the maximum signal power in correlation operation, the optimal $S_{test}$ test sequence is selected as:

$$S_{test}[k-r] = S_1[k-r] * S_2[k-r] * S_3[k-r] \quad (9.3).$$

where r is the index of the maximum filter's coefficient.

The maximum correlation value occurs at a non-zero offset position and is also proportional to $\bar{a}_3$ as shown in (10).

$$R_{Vout,Stest}[-r] = \frac{1}{L}\sum_{k=1}^{L}\mu_r^3 \bar{a}_3 S_{test}[k-r]^2 + \frac{1}{L}\sum \text{other\_terms} \quad (10)$$

As a result of the partial correlation of two PN sequences other terms in (8) are not averaged to zero, but to some estimation variance. A signal to noise ratio (SNR) formula can quantify the estimation accuracy. Among the baseband output as shown in (4), the signal is defined as the terms correlated with $S_{test}$ sequence and noise is defined as those terms uncorrelated with $S_{test}$ sequence. The signal power is the square of the coefficients of $S_{test}$ term and the noise power is the variance of non_$S_{test}$ terms and the ratio is denoted by $SNR_{in}$, which represents the SNR before the correlation operation.

$$SNR_{in} = \frac{S}{N} = \frac{(C_1 a_3 + C_2 a_5)^2}{3(C_3 a_1 + C_4 a_3 + C_5 a_5)^2} \quad (11)$$

The PN sequences are assumed to be truly random for simplicity, which means each element of the sequences is independent of each other, and similar results can be achieved using other types of shift register generated PN sequences.

Figure 2:
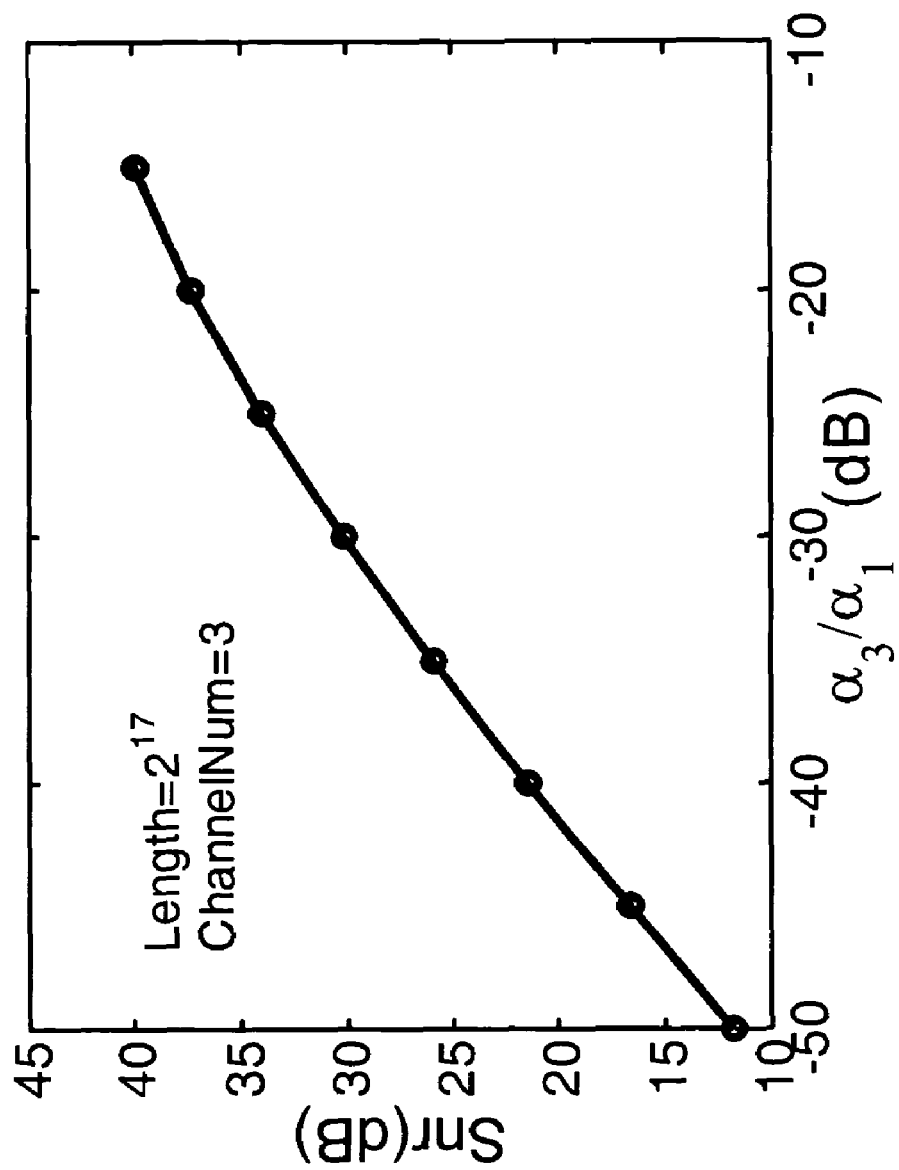
FIG. 2 graphically illustrates an increase in signal to noise ratio as a function of the ratio $\alpha_3$ to $\alpha_1$ which represents the ratio of nonlinear signal to linear signal, the signal to noise ratio is approximately a logarithmic function of the sequence length used to generate the test signal $S_{test}$.

After cross-correlation operation defined in (6), the SNR can be improved as shown in (12).

$$SNR_{out} = \frac{(C_1 a_3 + C_2 a_5)^2}{3(C_3 a_1 + C_4 a_3 + C_5 a_5)^2} = SNR_{in} + G_p \quad (12)$$

where $G_p$ (in dB)=$10\log_{10}(L)$ is the processing gain due to the correlation. The $SNR_{out}$ is improved compared with $SNR_{in}$ since the noise power is reduced by the correlation. It can be seen from (12) that $SNR_{out}$ depends on the sequence length, the ratio of polynomial coefficients and numerical constants that depend on the channel number of the input signal. FIG. 2 illustrates the dependence of $SNR_{out}$ upon the sequence length of sequences used to form the test signal $S_{test}$. For example, if it is assumed that the values of $C_i$ (i from 1 to 5) are of same order and the $a_5$, which is much less than $\alpha_3$ and $\alpha_1$, is ignored, (12) can be approximated as:

$$SNR_{out} \approx \frac{L}{3(1 + a_1/a_3)^2} \qquad (13)$$

To achieve better $SNR_{out}$, the linear part of output signal proportional to $\alpha_1$ should be cancelled out, since it is uncorrelated with the $S_{test}$ sequence and contributes noise power in our correlation estimation method.

FIG. 2 shows the $SNR_{out}$ increases as the ratio of $\alpha_3$ to $\alpha_1$ increases for the case without the baseband filter. The $SNR_{out}$ determinates the correlation estimation accuracy and limits the order of nonlinear polynomial model. For example, the ratio of $\alpha_5$ to $\alpha_1$ is usually much smaller than the ratio of $\alpha_3$ to $\alpha_1$; therefore the $SNR_{out}$ of the $5^{th}$ order nonlinearity is poorer than that of the $3^{rd}$ order. For a fixed processing gain, the estimation error of order higher than five may exceed the error tolerance bounds.

Figure 3:
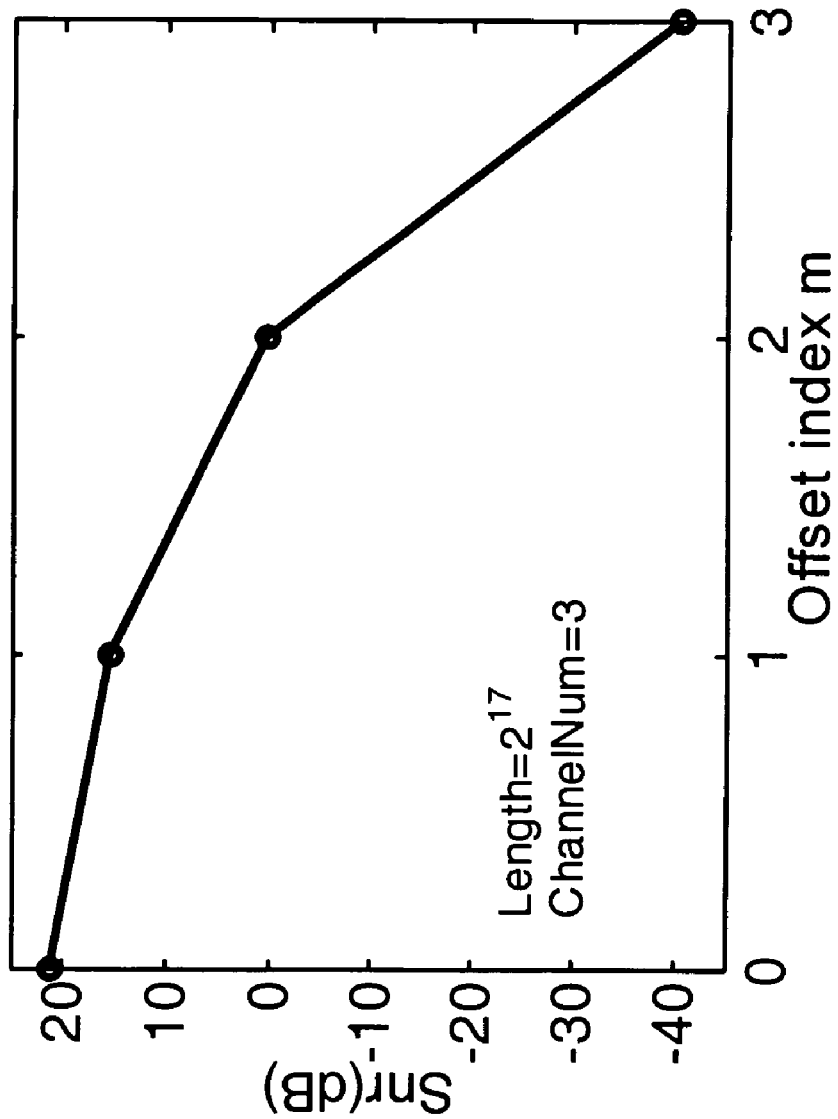
FIG. 3 illustrates that $SNR_{out}$ degrades as the time misalignment increases between the output signal and $S_{test}$ sequence from the optimal offset position.

The peak correlation occurs at a particular offset position for a given baseband filter. FIG. 3 shows that $SNR_{out}$ degrades as the time misalignment increases between the output signal and $S_{test}$ sequence from the optimal offset position. The filter considered herein is a standard IS-95 48-tap FIR filter.

The previous analysis can be extended to the complex baseband input signal case. The input signal in its rectangular format is $$\tilde{V}_{in} = I + jQ \qquad (14).$$

where I and Q are in phase and quadrature signals, which are each the summation of several PN sequences. Substituting (14) into (1), for nonlinearity extraction purpose, the nonlinear in phase portion of the output signal with odd order higher than or equal to three can be written as $$V_{out\_I} = \alpha_{3r}I^3 + 2\alpha_{5r}Q^2I^3 + \alpha_{5r}I^5 - (\alpha_{3i}Q^3 + 2\alpha_{5i}I^2Q^3 + \alpha_{5i}Q^5) \qquad (15).$$

where $\alpha_{nr}$ and $\alpha_{ni}$ are the real and imaginary part of the complex coefficients $\tilde{\alpha}_n$ (n equal to 1, 3, and 5) respectively. The equivalent complex nonlinear coefficients can be extracted by correlation of $V_{out\_I}$ and in phase or quadrature $S_{test}$ sequences.

$$\text{Max}\{R_{V_{out\_I},S_{test\_I}}\} \propto C_1\alpha_{3r} + C_2\alpha_{5r} = \overline{\alpha}_{3r}$$

$$\text{Max}\{R_{V_{out\_I},S_{test\_Q}}\} \propto C_1\alpha_{3i} + C_2\alpha_{5i} = \overline{\alpha}_{3i} \qquad (16)$$

where $C_1$ and $C_2$ are numerical constants. The maximum power correlation value $P_{corr}$ is defined as the sum of the squares of the real and imaginary extracted coefficients, i.e., $$P_{corr} = \overline{\alpha}_{3r}^2 + \overline{\alpha}_{3i}^2 = C_1^2|\tilde{\alpha}_3|^2 + C_2^2|\tilde{\alpha}_5|^2 + 2C_1C_2\Re\{\tilde{\alpha}_3\tilde{\alpha}_5^*\} \qquad (17).$$

where $\Re$ is the real part operator and * denotes the complex conjugate.

Figure 5:
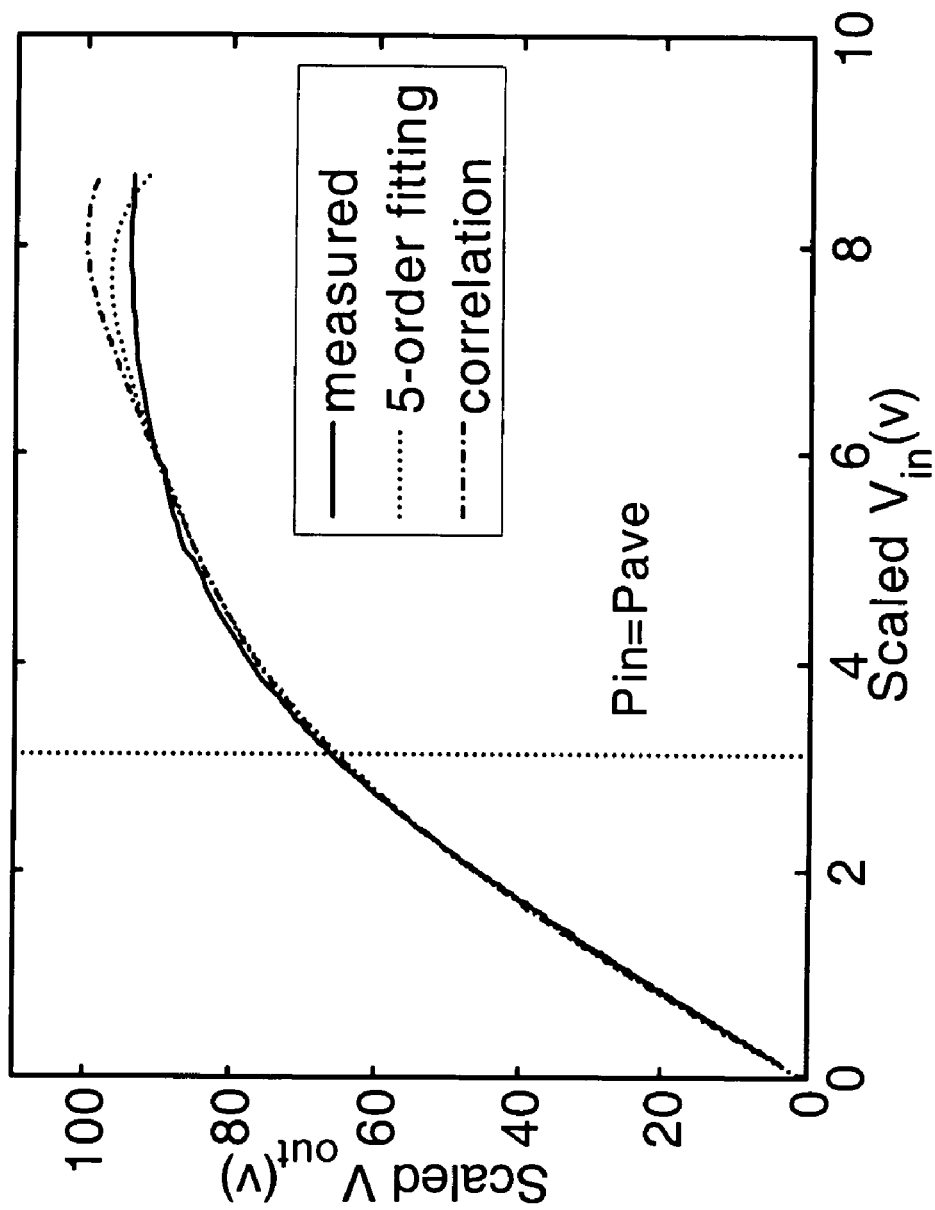
FIGS. 5 and 6 respectively plot AM-AM (scaled output amplitude vs. scaled input amplitude) and AM-PM (phase shift vs. scaled input amplitude) nonlinear characteristics (solid curves) and the best fit results with a fifth-order polynomial (dashed curves) from the FIG. 4.
Figure 6:
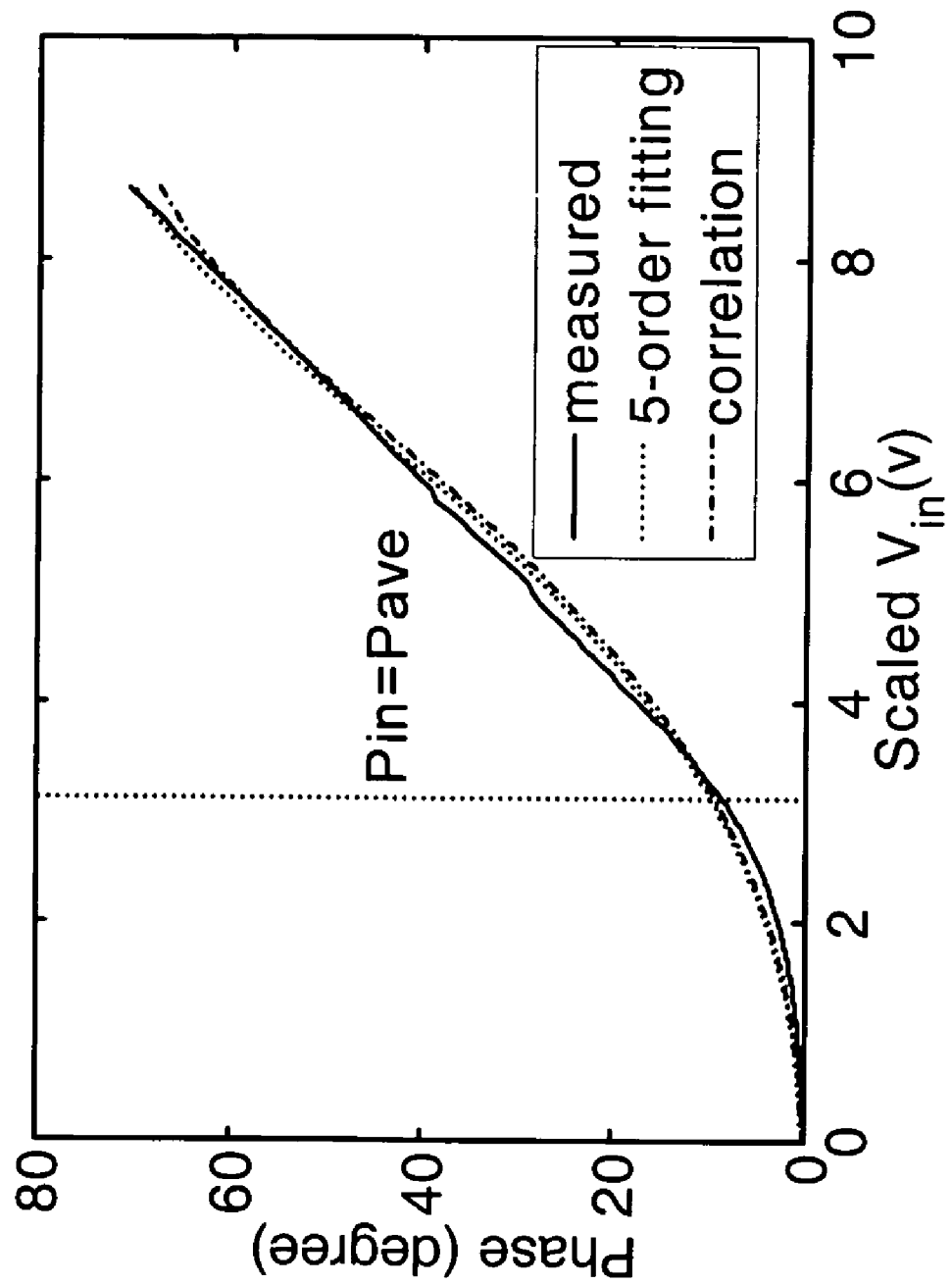

FIG. 4 illustrates a MATLAB simulation set-up that was used to verify the FIG. 1 method and device for estimating power amplifier nonlinearity in accordance with the invention;. Five PN sequences generated by the random function randn in MATLAB were over-sampled by four and filtered also by the same IS-95 FIR filter. The PA is a fifth-order complex polynomial model of a commercial Intersil ISL3990 dual-band GaAs PA. FIGS. 5 and 6 plot the measured AM-AM and AM-PM nonlinear characteristics (solid curves) and the best fit results with a fifth-order polynomial (dashed curves).

The $1^{st}$, $3^{rd}$, and $5^{th}$ coefficients were then extracted by the correlations of the simulated model output and different order $S_{test}$ sequences. Using these extracted coefficients, AM-AM and AM-PM polynomial fitting curves were reconstructed as shown by dash-dot curves in FIGS. 5 and 6. The matching between measured (in simulation) and correlation extracted curves is good around the average input power.

Figure 7:
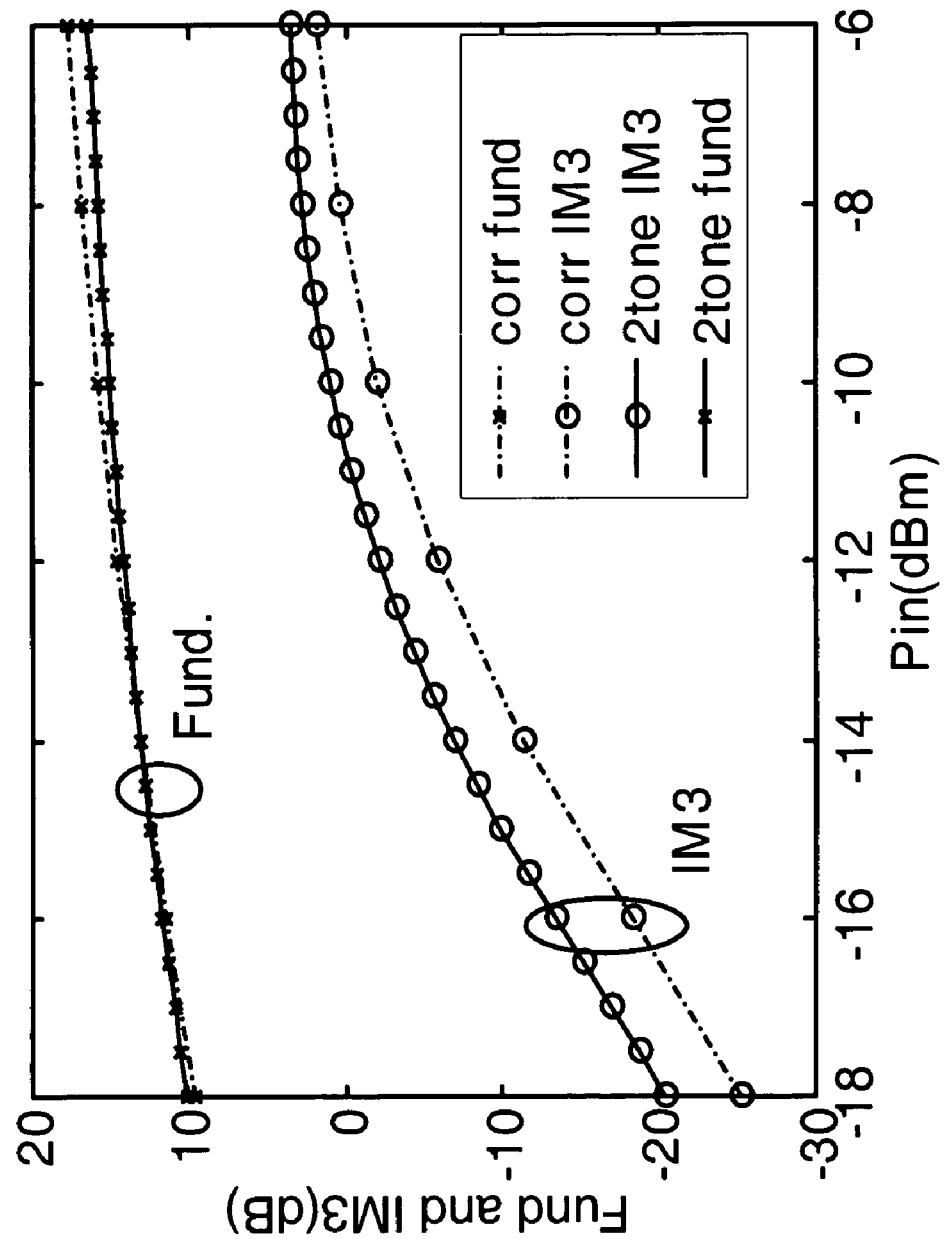
FIG. 7 shows a comparison of two-tone inter-modulation testing and correlation extraction simulation results.

FIG. 7 shows a comparison of two-tone inter-modulation testing and correlation extraction results. The solid curves are the measured (simulation). The solid curves are the measured results of a two-tone test, similar to the solid curves in FIGS. 5 and 6 of single-tone test results of fundamental and IM3 vs. the average input power. The dash-dot curves show the $1^{st}$ and $3^{rd}$ power correlation values vs. the average input power. They have very similar trends as the power level is swept.

Spectral regrowth can be estimated from amplifier nonlinearity, together with input signal characteristics using statistical analysis. The time-averaged autocorrelation of the output envelope $\tilde{R}_{yy}$ can be described as a function of the input autocorrelation $\tilde{R}_{xx}$ with different orders:

$$\tilde{R}_{yy}[m] = P_1\tilde{R}_{xx}[m] + P_3\tilde{R}^*_{xx}[m]\tilde{R}_{xx}^2[m] + P_5\tilde{R}^*_{xx}^2[m]R_{xx}^3[m] \qquad (18)$$

where $\tilde{R}^*_{xx}$ is the complex conjugate of $\tilde{R}^*_{xx}$ and $P_1$, $P_3$, and $P_5$ represent the coefficients of different orders of the input autocorrelation. $P_3$ and $P_5$ are functions of the complex polynomial coefficients and $P_3$ is $$P_3 = K_1^2|\tilde{\alpha}_3|^2 + K_2^2|\tilde{\alpha}_5|^2 + 2K_1K_2\Re\{\tilde{\alpha}_3\tilde{\alpha}_5^*\} \qquad (19).$$

$K_1$ and $K_2$ are constant numbers for a given input signal and their detailed derivation is known in the art.

Figure 8:
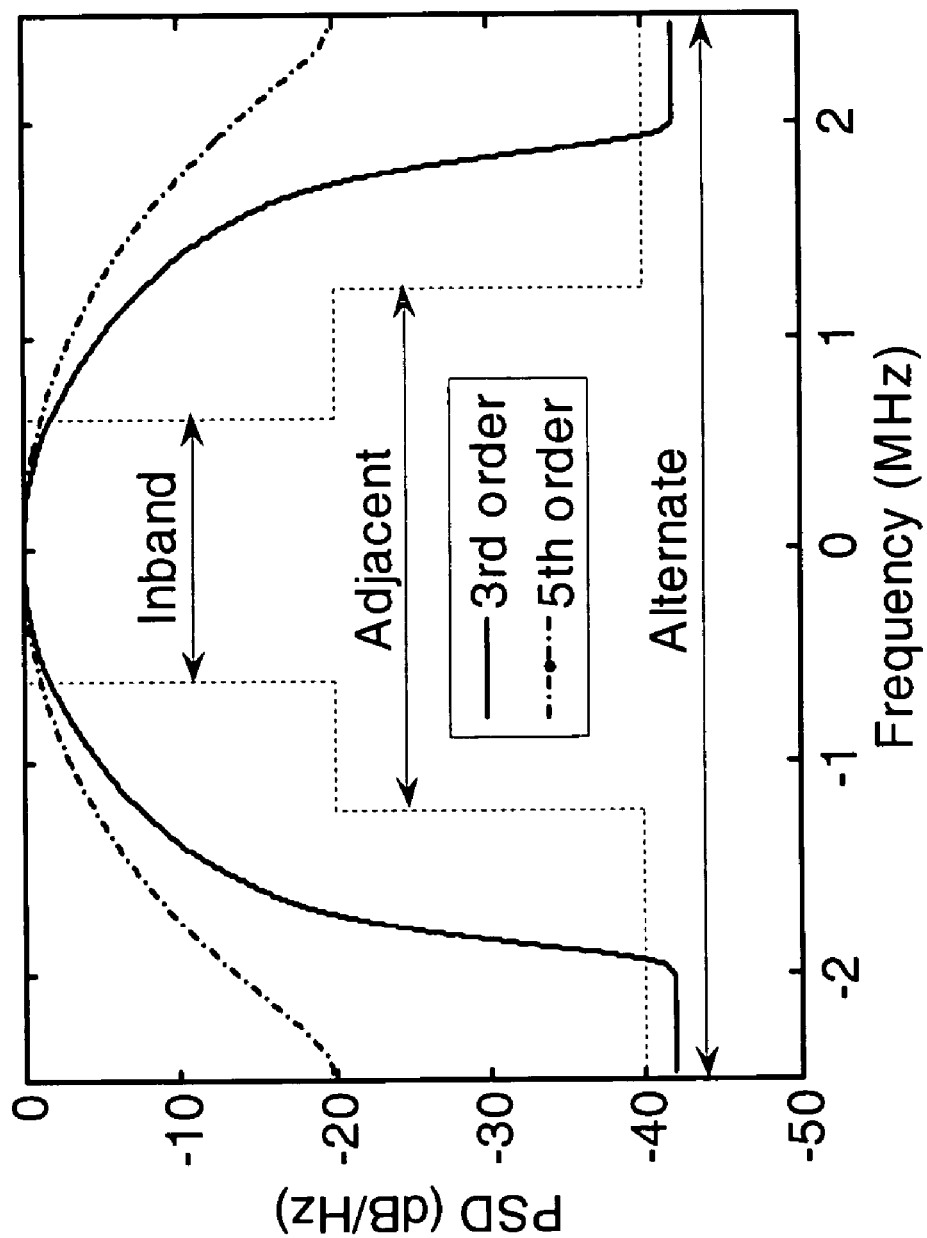
FIG. 8 illustrates normalized Fourier transform of the (simulated) $3^{rd}$ and $5^{th}$ order input autocorrelation.

The output power spectrum is the Fourier transform of the output autocorrelation $\tilde{R}_{yy}$. The same simulation setup as FIG. 4 was used and the normalized Fourier transform of the $3^{rd}$ and $5^{th}$ order input autocorrelation in (18) is shown in FIG. 8. It can be seen that the adjacent and alternate channel leakage power is due to the $3^{rd}$ and $5^{th}$ order nonlinearity. The out-of-band power is largely proportional to $P_3$ and $P_5$ respectively, since they are the coefficients of different orders of the input autocorrelation in (18).

Comparing (19) with (17), the conclusion can be drawn that both the out-of-band power and the maximum power correlation values have very similar dependence on the polynomial coefficients. This is a fair indication that the correlation values are excellent indicators of the system nonlinearity and spectral regrowth.

Figure 9:
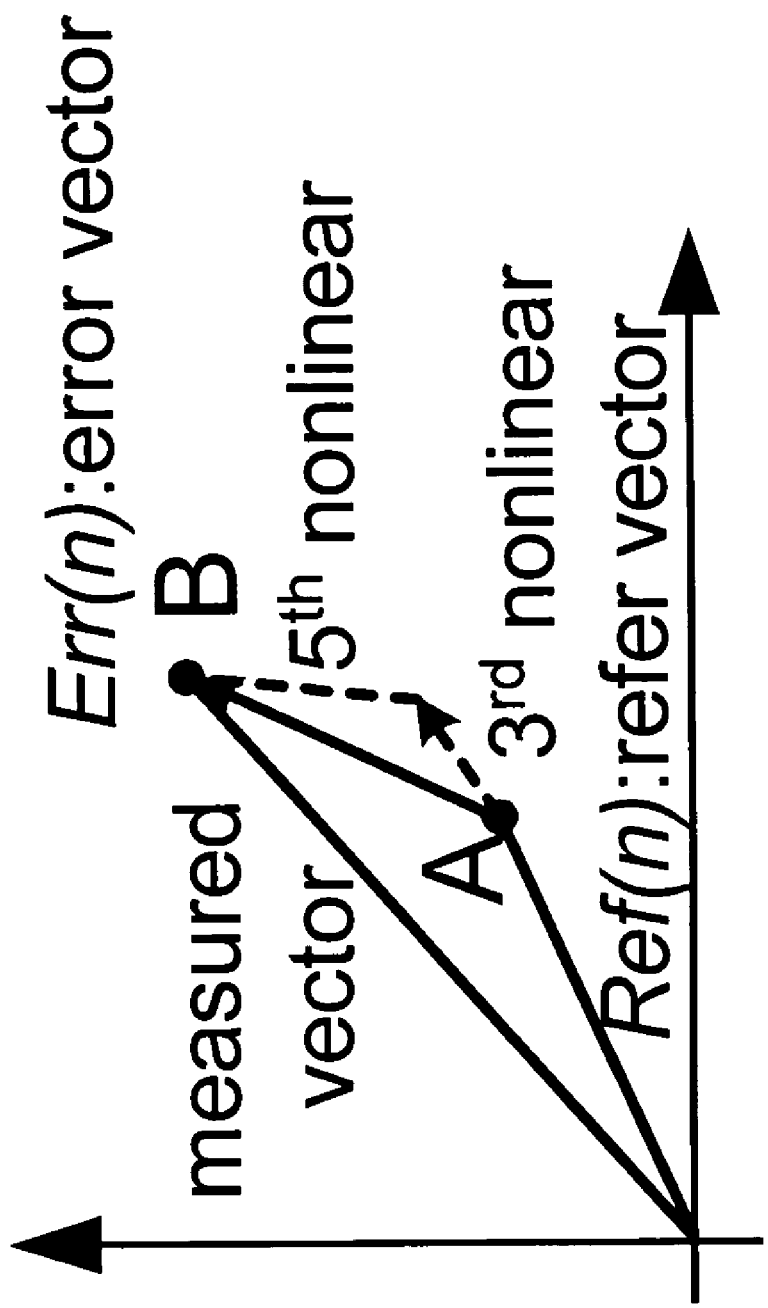
FIG. 9 is a graphical representation of the error vector magnitude for a transmitter.

PA nonlinearity is a major contributor to the error vector magnitude (EVM) of most transmitters FIG. 9 illustrates the error vector magnitude of a transmitter. Point A is the ideal symbol (or chip) position and point B is the actual measured position in a complex modulation plane. The vector difference between points A and B is the error vector, and root-mean-square (rms) EVM in (20) is usually described as the percentage value of the rms value of error vector magnitude normalized to the rms value of the ideal symbol magnitude.

$$EVM(\text{rms}) = \frac{\sqrt{\sum_{n=1}^{N} Err(n)^2 / N}}{\sqrt{\sum_{n=1}^{N} Ref(n)^2 / N}} \quad (20)$$

The EVM calculation procedure for DS-CDMA signals used herein is as follows. The sampled input signal (at chip time) is used as the reference vector and the sampled output signal (at chip time) after linear gain scaling and constant phase rotation is used as the measured vector. The difference between them is the error vector, which is due to the $3^{rd}$ and $5^{th}$ order nonlinearity of the polynomial PA as shown in FIG. 9. The squared magnitude of the error vector can be written as a quadratic function of the nonlinear coefficients:

$$Err(n)^2 = K'_1{}^2(n)|\tilde{\alpha}_3|^2 + K'_2{}^2(n)|\tilde{\alpha}_5|^2 + 2K'_1(n)K'_2(n)\Re\{\tilde{\alpha}_3\tilde{\alpha}^*_5\} \quad (21)$$

where $K'_1$, and $K'_2$ are constant numbers for a given input signal, which depend on the magnitude of the input reference vectors. Comparing (21) with (17), the conclusion can be drawn that both the squared magnitude of error vector and the $3^{rd}$ order maximum power correlation value have very similar dependence on the polynomial coefficients.

Figure 10:
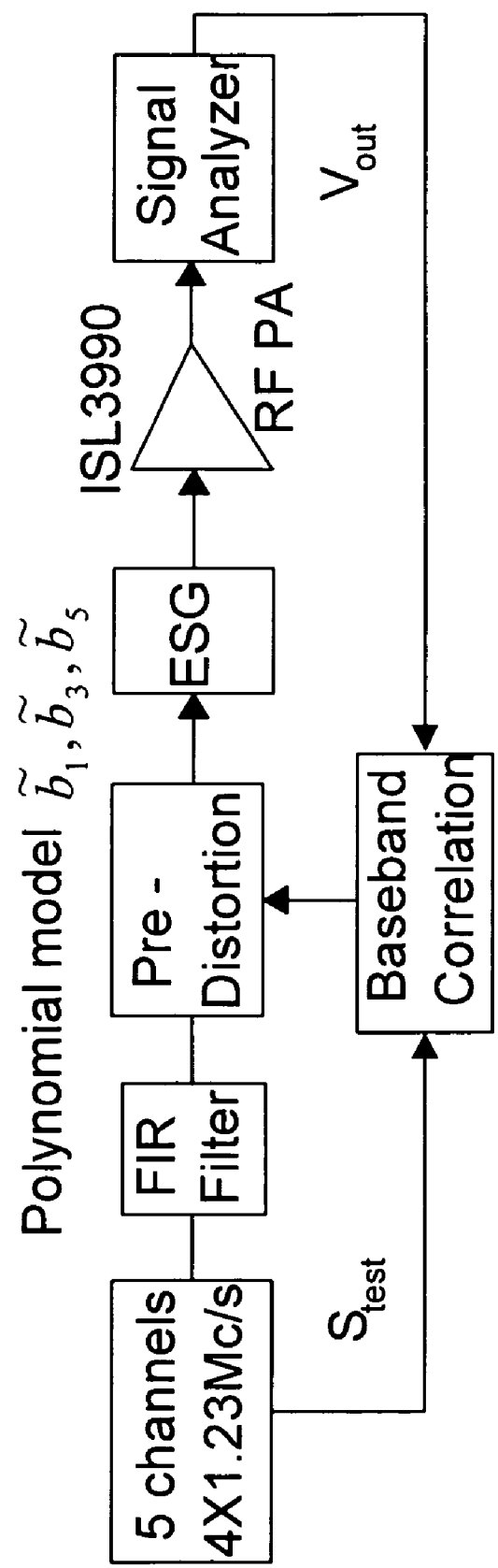
FIG. 10 illustrates a simulation experimental test set up for power sweep simulation measurements of a system including a predistorter estimating power amplifier nonlinearity in accordance with the invention.

Power sweep simulation measurements were also made, and the experimental test environment is shown in FIG. 10. The baseband input signals were generated with MATLAB and downloaded to an Agilent ESG waveform generator as the RF input to the PA under test. The PA is the same Intersil ISL3990 PA used in simulations. The baseband output signals were collected by an Agilent PSA spectrum analyzer and VSA vector signal analyzer, which have large enough bandwidth and linear dynamic range to ignore their nonlinearity contributions. The PA's equivalent nonlinearity characteristics were changed by using a baseband polynomial predistorter (PD) implemented in MATLAB.

Figure 11A:
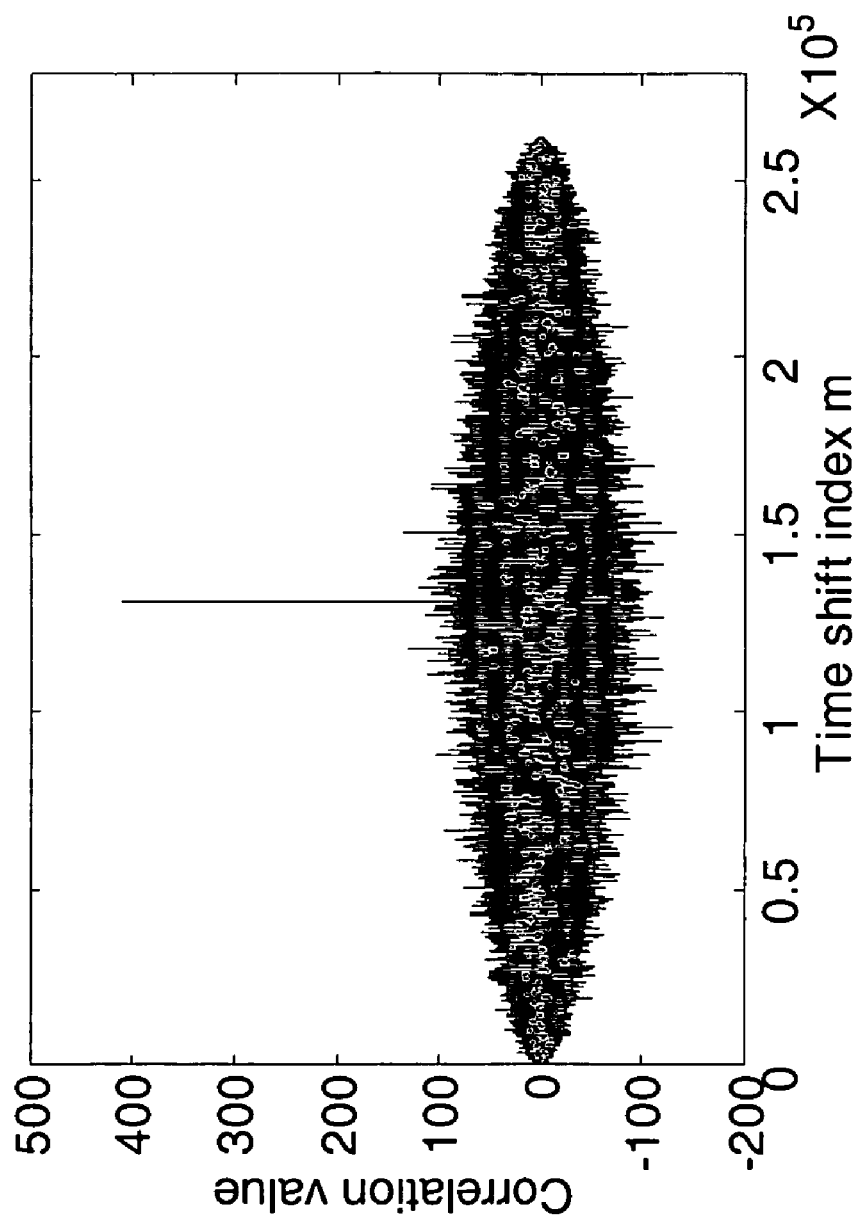
FIGS. 11A and 11B respectively show correlation values of $3^{rd}$ and $5^{th}$ order with Pin=−6 dBm; the correlation values are shown vs. time shift position with a polynomial predistorter applied based upon the estimated nonlinearity determined by the cross correlation method of the invention.
Figure 11B:
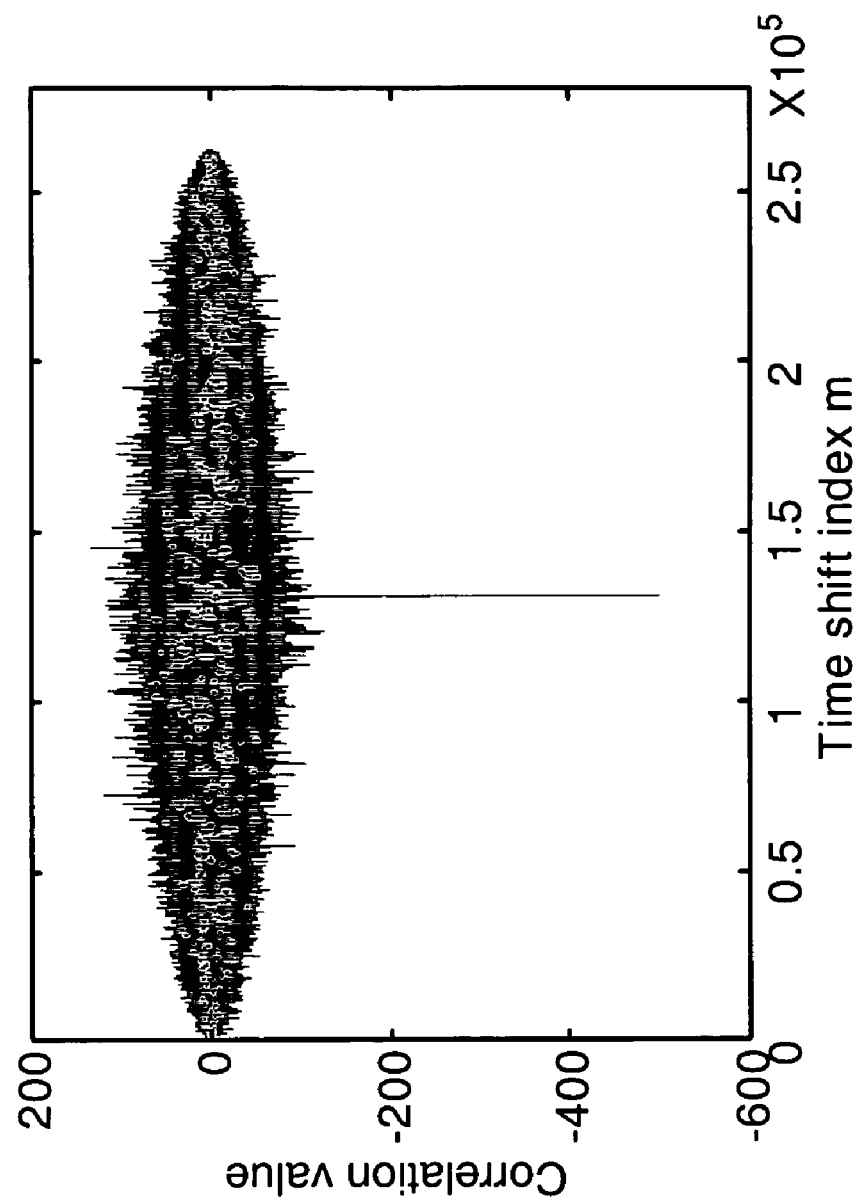
Figure 12:
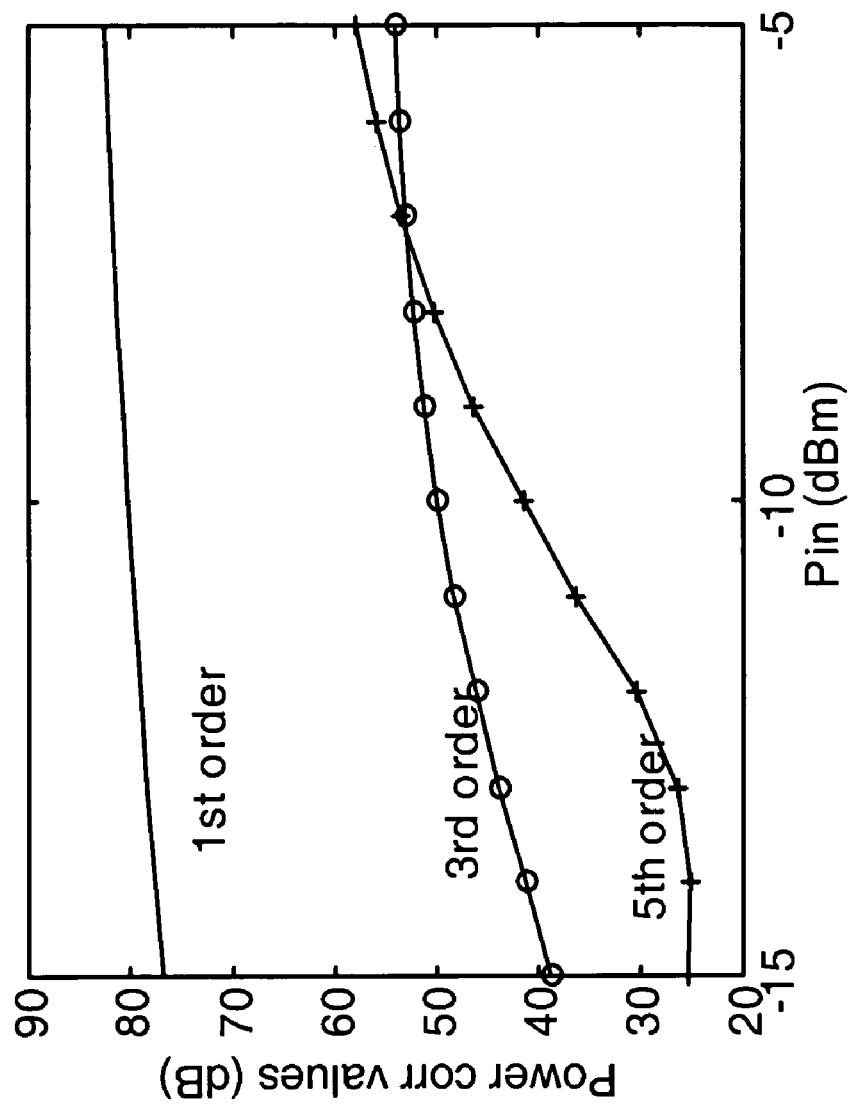
FIG. 12 illustrates power correlation values of different order vs. swept input power without the polynomial predistorter.

FIGS. 11 and 11B respectively show $3^{rd}$ and $5^{th}$ order correlation values vs. time shift position with a polynomial predistorter applied based upon the estimated nonlinearity determined by the cross correlation method of the invention. In FIGS. 11A and 11B, Pin=−6 dBm, and the cross-correlation peak is proportional to the $\tilde{\alpha}_3$ coefficient. The power correlation values of different order vs. swept input power without the polynomial predistorter are shown in FIG. 12. These curves have similar trends as the fundamental, IM3, and IM5 changes vs. the input power in the two-tone measurements.

Figure 13:
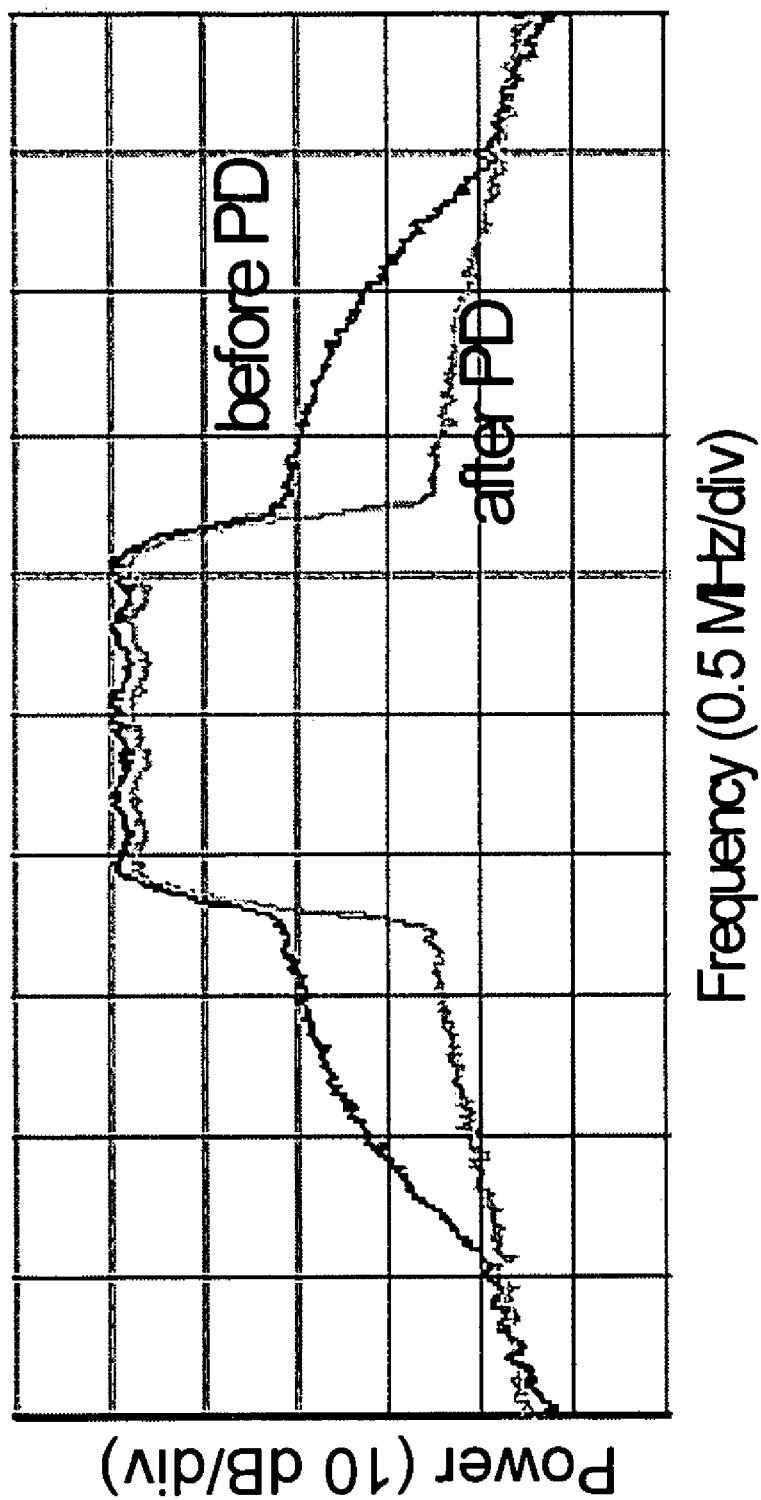
FIG. 13 shows that the ACPR (adjacent channel power ratio) was improved by experimental minimization of the correlation values.

Predistortion simulation testing was also conducted. FIG. 13 shows that the ACPR was improved by experimental minimization of the correlation values. The output signals after predistortion have smaller correlation values and better ACPR than before predistortion.

Figure 14A:
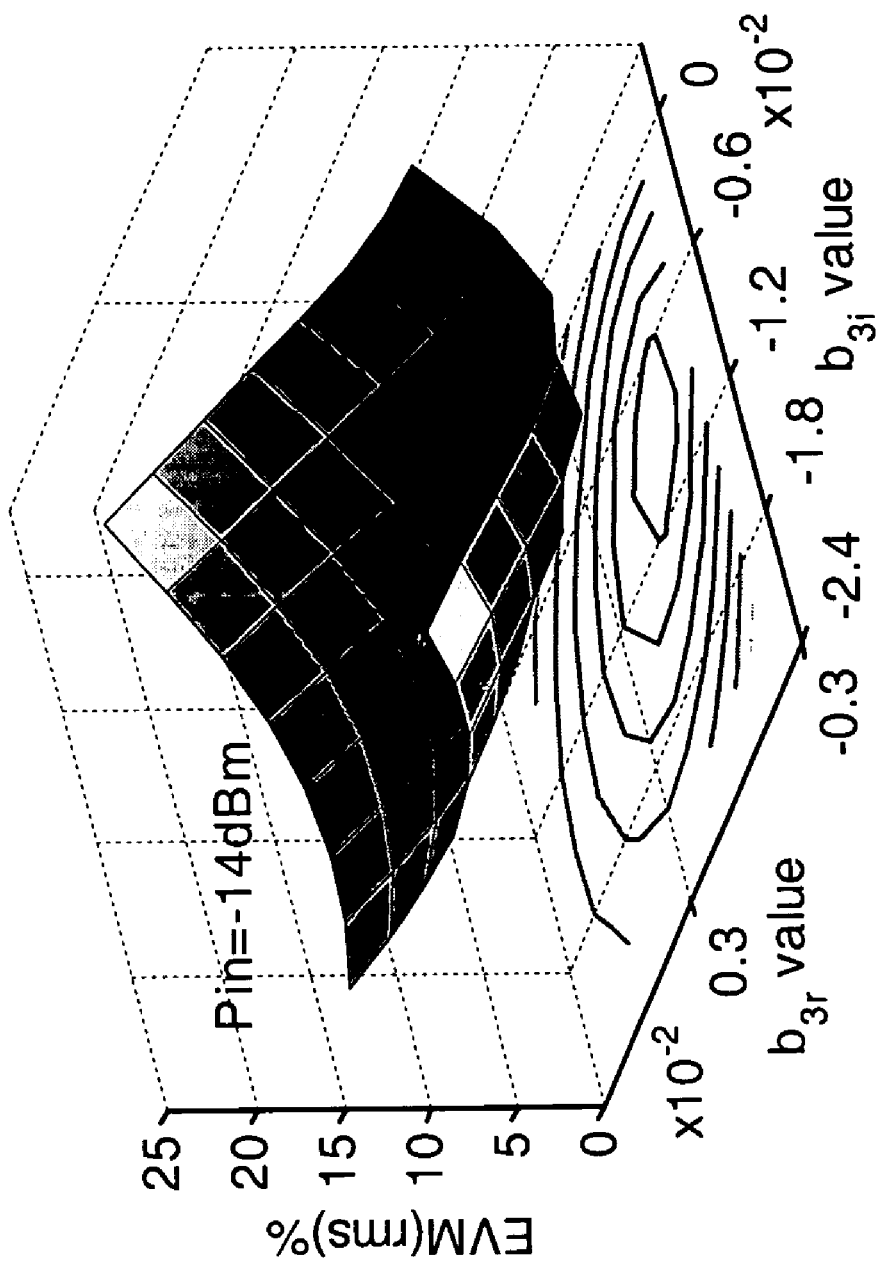
FIGS. 14A and 14B respectively illustrate three-dimension contours of EVM (rms) and power correlation values (in linear scale) vs. the predistorter's coefficient $b_3$.
Figure 14B:
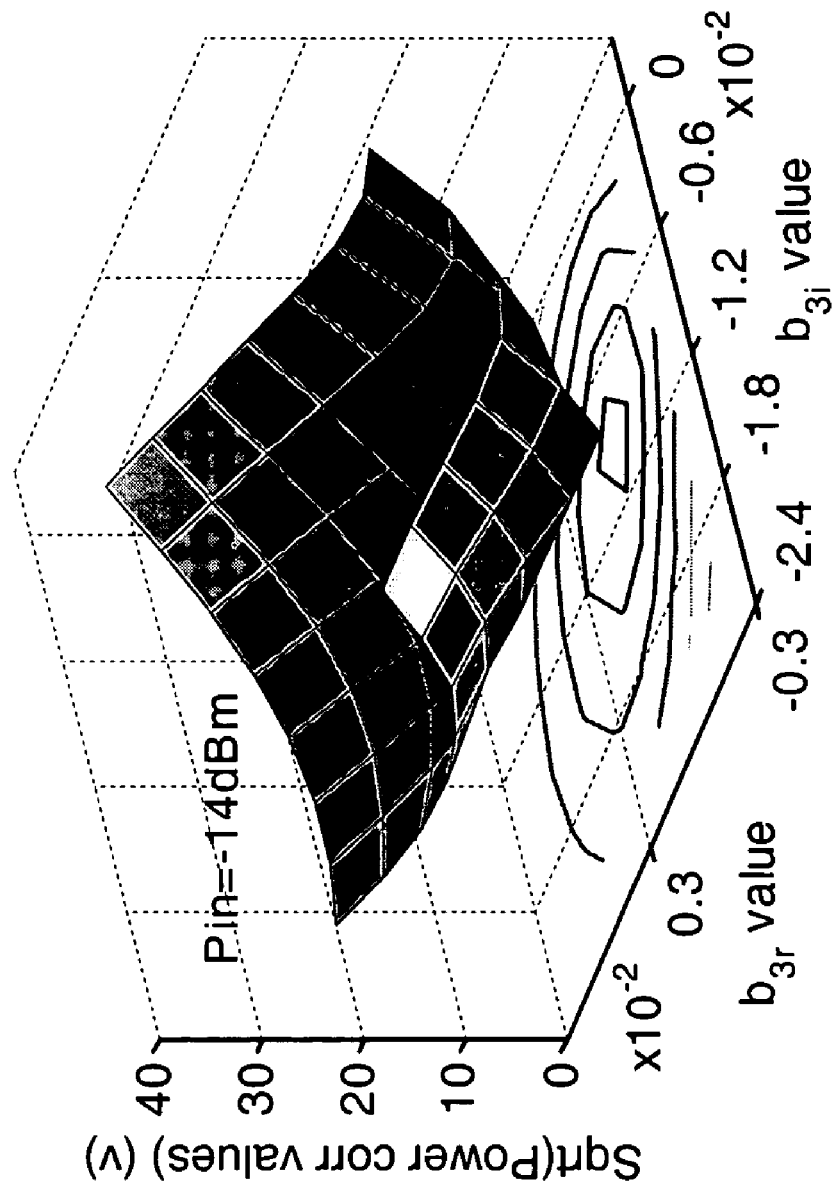

The three-dimension contours of EVM (rms) and power correlation values (in linear scale) vs. the predistorter's coefficient $\tilde{b}_3$ are respectively shown in FIGS. 14A and 14B. The similarity of these characteristics confirms the preceding analysis.

The simulations show that the straightforward correlation techniques of the invention can estimate the nonlinearity of a power amplifier in a wireless transmitter and predict the spectral regrowth and constellation distortion with actual multichannel DS-CDMA signals. Preferred methods and devices of the invention estimate power amplifier nonlinearity and apply corrective predistortion in real time during normal operation of the power amplifier and a transceiver circuit including the power amplifier.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for monitoring a power amplifier that has digitally modulated inputs and an output containing more than one signal stream, the method comprising steps of:
    creating a test signal by forming the products of several pseudorandom noise sequences from the digitally modulated inputs to the power amplifier; and
    determining nonlinear contributions of the power amplifier output by cross-correlating the test signal and the total output signal of the power amplifier.

2. The method of claim 1, wherein said step of determining determines third and fifth order nonlinear contributions of the power amplifier.

3. The method of claim 2, further comprising a step of adding corrective predistortion to the power amplifier to counteract the determined nonlinear contributions of the power amplifier.

4. The method of claim 1, further comprising a step of adding corrective predistortion to the power amplifier to counteract the determined nonlinear contributions of the power amplifier.

5. The method of claim 4, wherein said steps of creating, determining and adding are conducted during normal operation of the power amplifier.

6. The method of claim 1, implemented in a wireless network base station.

7. The method of claim 1, implemented in a wireless network node device.

8. The method of claim 1, wherein the digitally modulated inputs comprise Walsh-code modulated signals that are spread by pseudorandom noise code sequences.

9. The method of claim 1, wherein the digitally modulated inputs comprise Direct-Sequence Code Divisional Multiple Access input signals.

10. A wireless transceiver device, the device comprising:
    a power amplifier;
    digitally modulated inputs to said amplifier and an output from said amplifier containing more than one signal stream; and
    means for monitoring the power amplifier according to the monitoring method of claim 1.

* * * * *

UNITED STATES PATENT AND TRADEMARK OFFICE
CERTIFICATE OF CORRECTION

| | | |
|---|---|---|
| PATENT NO. | : 7,652,532 B2 | Page 1 of 3 |
| APPLICATION NO. | : 11/515584 | |
| DATED | : January 26, 2010 | |
| INVENTOR(S) | : Li et al. | |

It is certified that error appears in the above-identified patent and that said Letters Patent is hereby corrected as shown below:

On the Title Page

Item (56) Cited References - OTHER PUBLICATIONS
In the first cited reference: S. Boumaiza, F.M. Ghannouchi, please insert on the first line --characterization-- between "power-amplifiers" and "with".

| | |
|---|---|
| Col. 6, line 27 | Delete "$\alpha_1, \alpha_3,$" and insert -- $a_1, a_3,$ -- in its place. |
| Col. 6, line 28 | Delete "$\alpha_5$" and insert -- $a_5$ -- in its place. |
| Col. 6, line 53 | Delete "$\overline{\alpha_3}$" and insert -- $\overline{a_3}$ -- in its place. |
| Col. 6, line 54 | Delete "$\alpha_3$" and insert -- $a_3$ -- in its place. |
| Col. 6, line 55 | Delete "$\alpha_5$" and insert -- $a_5$ -- in its place. |
| Col. 7, line 50 | Delete "$\overline{\alpha_3}$" and insert -- $\overline{a_3}$ -- in its place. |
| Col. 8, line 29 | Delete "$\overline{\alpha_3}$" and insert -- $\overline{a_3}$ -- in its place. |
| Col. 8, line 62 | Delete the lower portion of the equation: "$3(C_3 a_1 + C_4 a_3 + C_5 a_5)^2$" and replace it with: -- $3(C_3 a_1 + C_4 a_3 + C_5 a_5)^2 / L$ --. |

Signed and Sealed this
First Day of March, 2011

David J. Kappos
*Director of the United States Patent and Trademark Office*

CERTIFICATE OF CORRECTION (continued)
U.S. Pat. No. 7,652,532 B2

In the Specification *(Continued)*:

| | |
|---|---|
| Col. 9, line 7 | Delete "$\alpha_3$" and insert -- $a_3$ -- in its place. |
| Col. 9, line 8 | Delete "$\alpha_1$" and insert -- $a_1$ -- in its place. |
| Col. 9, line 16 | Delete "$\alpha_1$" and insert -- $a_1$ -- in its place. |
| Col. 9, line 19 | Delete "$\alpha_3$ to $\alpha_1$" and insert -- $a_3$ to $a_1$ -- in its place. |
| Col. 9, line 23 | Delete "$\alpha_5$ to $\alpha_1$ is usually much smaller than the ratio of $\alpha_3$" and insert -- $a_5$ to $a_1$ is usually much smaller than the ratio of $a_5$ -- in its place. |
| Col. 9, line 24 | Delete "$\alpha_1$" and insert -- $a_1$ -- in its place. |
| Col. 9, ll. 43-44 | Delete the equation: |

$$V_{out\_1} = \alpha_{3r}I^3 + 2\alpha_{5r}Q^2I^3 + \alpha_{5r}I^5 - (\alpha_{3i}Q^3 + 2\alpha_{5i}I^2Q^3 + \alpha_{5i}Q^5)$$

And replace it with:

$$V_{out\_1} = a_{3r}I^3 + 2a_{5r}Q^2I^3 + a_{5r}I^5 - (a_{3i}Q^3 + 2a_{5i}I^2Q^3 + a_{5i}Q^5)$$

| | |
|---|---|
| Col. 9, line 45 | Delete "$\alpha_{nr}$ and $\alpha_{ni}$" and insert -- $a_{nr}$ and $a_{ni}$ -- in its place. |
| Col. 9, line 46 | Delete "$\alpha_n$" and insert -- $\tilde{a}_n$ -- in its place. |
| Col. 9, ll. 52-53 | Delete the sequences: |

$$Max\{R_{Vout\_I,Stest\_I}\} \alpha\ C_1\alpha_{3r} + C_2\alpha_{5r} = \bar{a}_{3r}$$
$$Max\{R_{Vout\_I,Stest\_I}\} \alpha\ C_1\alpha_{3i} + C_2\alpha_{5i} = \bar{a}_{3i}$$

and replace it with the following sequences:

$$Max\{R_{Vout\_I,Stest\_I}\} \propto C_1 a_{3r} + C_2 a_{5r} = \bar{a}_{3r}$$
$$Max\{R_{Vout\_I,Stest\_Q}\} \propto C_1 a_{3i} + C_2 a_{5i} = \bar{a}_{3i}$$

| | |
|---|---|
| Col. 9, ll. 58-59 | Delete the equation: |

$$P_{corr} = \bar{a}_{3r}^2 + \bar{a}_{3i}^2 = C_1^2|\tilde{\alpha}_3|^2 + C_2^2|\tilde{\alpha}_5|^2 + 2C_1C_2\Re\{\tilde{\alpha}_3\tilde{\alpha}_5^*\}$$

and replace it with the following equation:

$$P_{corr} = \bar{a}_{3r}^2 + \bar{a}_{3i}^2 = C_1^2|\tilde{a}_3|^2 + C_2^2|\tilde{a}_5|^2 + 2C_1C_2\Re\{\tilde{a}_3\tilde{a}_5^*\}$$

| | |
|---|---|
| Col. 9, line 65 | Delete "tion;." and insert --tion.-- in its place. |

CERTIFICATE OF CORRECTION (continued)
U.S. Pat. No. 7,652,532 B2

In the Specification *(Continued)*:

| | |
|---|---|
| Col. 10, line 27 | Delete "$R_{yy}$" and replace it with -- $\tilde{R}_{yy}$ --. |
| Col. 10, line 28 | Delete "$R_{xx}$" and replace it with -- $\tilde{R}_{xx}$ --. |
| Col. 10, ll. 30-31 | Delete the equation: "$\tilde{R}_{yy}[m] = P_1 \tilde{R}_{xx}[m] + P_3 \tilde{R}^*_{xx}[m] \tilde{R}^2_{xx}[m] + P_5 \tilde{R}^{*2}_{xx}[m] \tilde{R}^3_{xx}[m]$", and replace it with the following equation: -- $\tilde{R}_{yy}[m] = P_1 \tilde{R}_{xx}[m] + P_3 \tilde{R}^*_{xx}[m] \tilde{R}^2_{xx}[m] + P_5 \tilde{R}^{*2}_{xx}[m] \tilde{R}^3_{xx}[m]$ --. |
| Col. 10, line 43 | Delete "$\tilde{R}_{yy}$" and replace it with -- $\tilde{R}_{yy}$ -- |
| Col. 11, ll. 19-20 | Delete the equation: "$Err(n)^2 = K'^2_1(n)|\tilde{a}_3|^2 + K'^2_2(n)|\tilde{a}_5|^2 + 2K'_1(n)K'_2(n)\Re\{\tilde{a}_3\tilde{a}^*_5\}$", and replace it with the following equation: -- $Err(n)^2 = K'^2_1(n)|\tilde{a}_3|^2 + K'^2_2(n)|\tilde{a}_5|^2 + 2K'_1(n)K'_2(n)\Re\{\tilde{a}_3\tilde{a}^*_5\}$ --. |
| Col. 11, line 44 | Delete "$a_3$" and insert -- $\tilde{a}_3$ -- in its place. |